US007777649B2

(12) United States Patent
De Ruyter et al.

(10) Patent No.: US 7,777,649 B2
(45) Date of Patent: Aug. 17, 2010

(54) ADVANCED CONTROL DEVICE FOR HOME ENTERTAINMENT UTILIZING THREE DIMENSIONAL MOTION TECHNOLOGY

(75) Inventors: Boris Emmanuel Rachmund De Ruyter, Neerpelt (BE); Detlev Langmann, Pinneberg (DE); Jiawen W. Tu, Shangai (CH); Vincentius Paulus Buil, Eindhoven (NL); Tatiana A. Lashina, Eindhoven (NL); Evert Jan Van Loenen, Waalre (NL); Sebastian Egner, Eindhoven (NL)

(73) Assignee: NXP B.V., Eindhoven (NL)

( * ) Notice: Subject to any disclaimer, the term of this patent is extended or adjusted under 35 U.S.C. 154(b) by 892 days.

(21) Appl. No.: 10/597,273

(22) PCT Filed: Jan. 17, 2005

(86) PCT No.: PCT/IB2005/050182

§ 371 (c)(1),
(2), (4) Date: Jul. 19, 2006

(87) PCT Pub. No.: WO2005/071636

PCT Pub. Date: Aug. 4, 2005

(65) Prior Publication Data

US 2008/0252491 A1 Oct. 16, 2008

Related U.S. Application Data

(60) Provisional application No. 60/537,800, filed on Jan. 20, 2004.

(51) Int. Cl.
*H03M 11/00* (2006.01)

(52) U.S. Cl. ......................... 341/20; 341/176; 345/157; 345/158; 382/185; 702/150

(58) Field of Classification Search ................. 341/173, 341/176, 20, 22; 345/158, 157; 702/150; 382/195
See application file for complete search history.

(56) References Cited

U.S. PATENT DOCUMENTS

| | | | | |
|---|---|---|---|---|
| 4,745,402 | A | 5/1988 | Auerbach | |
| 4,796,019 | A | 1/1989 | Auerbach | |
| 5,598,187 | A * | 1/1997 | Ide et al. | 345/158 |

(Continued)

FOREIGN PATENT DOCUMENTS

WO 9922338 A1 5/1999

OTHER PUBLICATIONS

H. Baldus et al, Sensor-Based Context Awareness, Nat. Lab. Technical Note 2002/247, Issued Sep. 2002, Koninklijke Philips Electronics N.V.

(Continued)

*Primary Examiner*—Albert K Wong

(57) ABSTRACT

A hand held device for generating commands and transferring data between the hand-held device and a base device (including consumer electronic equipment). The hand-held device detects the motion of the device itself, interpreting the motion as a command, and executing or transferring the command. The motion of the device can include gestures made by the user while holding the device, such as the motion of throwing the hand-held device toward a base device. The commands generated by the user range from basic on/off commands to complex processes, such as the transfer of data. In one embodiment, the user can train the device to learn new motions associated with existing or new commands. The hand-held device analyzes the basic components of the motion to create a motion model such that the motion can be uniquely identified in the future.

21 Claims, 7 Drawing Sheets

U.S. PATENT DOCUMENTS

| | | | | |
|---|---|---|---|---|
| 6,249,606 | B1 * | 6/2001 | Kiraly et al. | 382/195 |
| 6,347,290 | B1 * | 2/2002 | Bartlett | 702/150 |
| 6,603,420 | B1 | 8/2003 | Lu | |
| 6,750,801 | B2 * | 6/2004 | Stefanik | 341/176 |
| 7,123,180 | B1 * | 10/2006 | Daniell et al. | 341/176 |
| 7,233,316 | B2 * | 6/2007 | Smith et al. | 345/157 |
| 2002/0190947 | A1 | 12/2002 | Feinstein | |

OTHER PUBLICATIONS

V.P. Buil et al, Context Aware Personal Remote Control, Nat Lab. Technical Note 2001/533, Issued Apr. 2002, Koninklijke Philips Electronics N.V.

Ho-Sub Yoon et al, Hand Gesture Recognition Using Combined Features of Location, Angle and Velocity, Pattern Recognition, vol. 34, Issue 7, 2001, pp. 1491-1501.

Christopher Lee et al, Online, Interactive Learning of Gestures for Human/Robot Interfaces, The Robotics Institute, Carnegie Mellon University, Pittsburgh, IEEE International Conference on Robotics and Automation, Minneapolis, 1996.

Ari Y. Benbasat et al, An Inertial Measurement Framework for Gesture Recognition and Applications, MIT Media Laboratory, Cambridge, 2001.

* cited by examiner

ADVANCED CONTROL DEVICE FOR HOME ENTERTAINMENT UTILIZING THREE DIMENSIONAL MOTION TECHNOLOGY

CROSS REFERENCE TO RELATED APPLICATION

This application claims the benefit of U.S. provisional application Ser. No. 60/537,800 filed Jan. 20, 2004, which the entire subject matter is incorporated herein by reference.

The present invention relates to the control of home entertainment devices and applications, and more particularly, to a method and system for controlling and transferring data to home entertainment devices by manipulating a control device.

Hand-held devices, such as remote controls devices, are typically used to control consumer electronic devices, such as televisions and gaming machines. As the hand-held devices and consumer electronic devices have become more sophisticated, new techniques for inputting commands to the hand-held devices have been developed. These techniques include methods that detect the orientation of a hand-held device to generate a command. For example, U.S. Pat. Nos. 4,745,402 and 4,796,019 disclose methods for controlling the position of a cursor on a television. U.S. Pat. No. 6,603,420 discloses a remote control device that detects the direction of movement of the remote control device to control, e.g., the channel and volume selection of a television.

The ability of these hand-held devices to hold data and the development of more sophisticated capabilities in the consumer electronic devices has created new challenges for controlling these consumer electronic devices. For example, it is often necessary to transfer data from the hand-held device to the consumer electronic device or vice versa. The hand-held device should also provide a natural, efficient mechanism for indicating that an action, such as a data transfer, is to be performed. A need therefore exists for an improved hand-held device that is capable of efficiently generating commands and transferring data to or from consumer electronic devices.

An apparatus and method are disclosed for generating commands and transferring data between a hand-held device and a base device (including consumer electronic equipment). The hand-held device is capable of detecting the motion of the hand-held device itself, interpreting the motion as a command, and executing or transferring the command. The motion of the device can include gestures made by the user while holding the device, such as the motion of throwing the hand-held device toward a base device, as a user would do when swinging a tennis racket. The commands generated by the user range from basic on/off commands to complex processes, such as the transfer of data.

In one embodiment, the user can train the device to learn new motions associated with existing or new commands. For example, the user can make the motion of throwing the hand-held device toward the base device. The hand-held device analyzes the basic components of the motion to create a motion model such that the motion can be uniquely identified in the future.

A more complete understanding of the present invention, as well as further features and advantages of the present invention, will be obtained by reference to the following detailed description and drawings.

FIG. 1 shows an exemplary hand-held device of the present invention;

FIGS. 2A-B illustrate gestures that are interpreted as commands by the hand-held device of FIG. 1;

Figure 1:
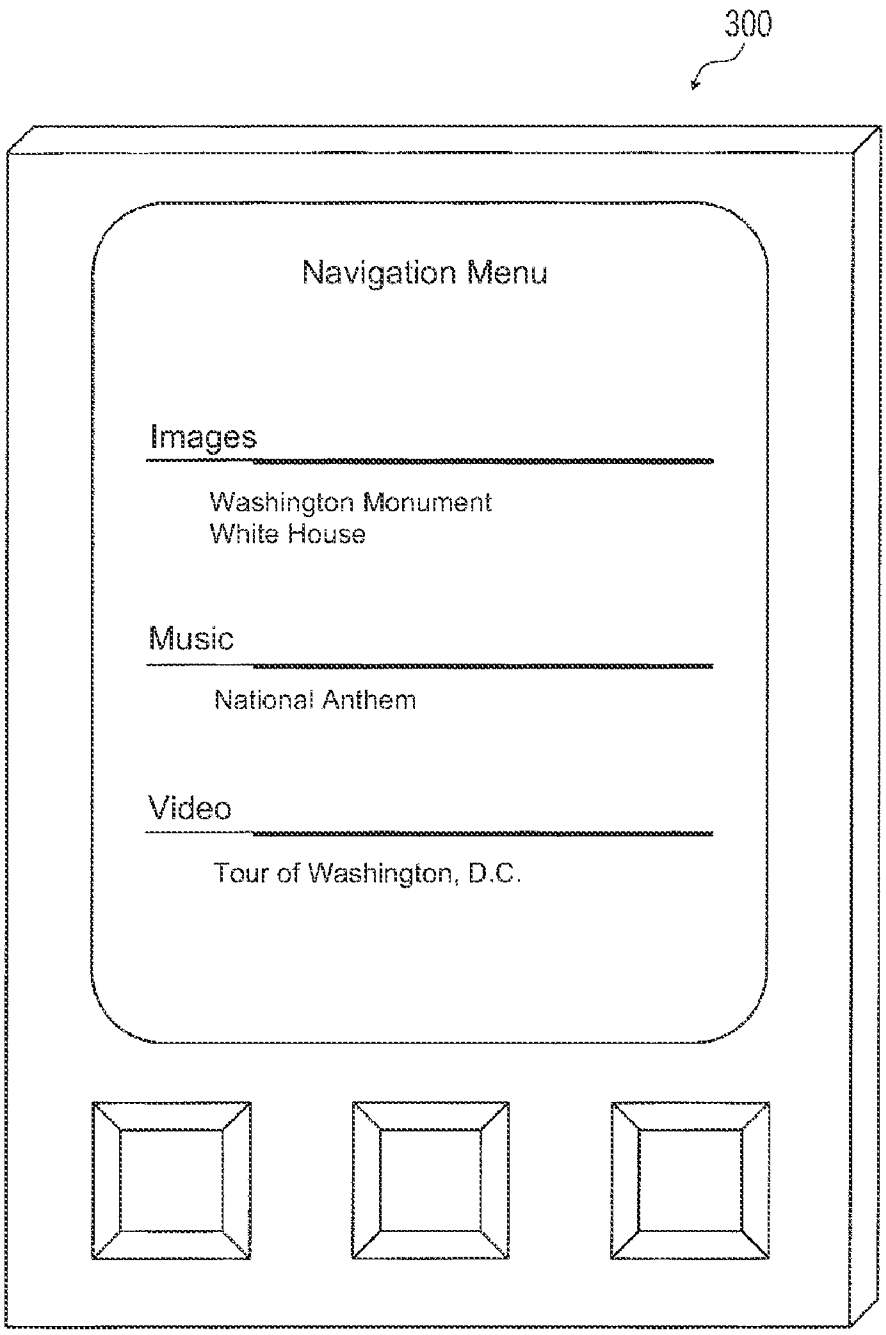

FIG. 1 shows an exemplary hand-held device 300 of the present invention, discussed further below in conjunction with FIG. 3, such as the Philips Super Pronto, modified in accordance with the features of the present invention. The hand-held device 300 is capable of detecting motion of the hand-held device 300, interpreting the detected motion as one or more commands, and executing or transferring the command(s).

Figure 2A:
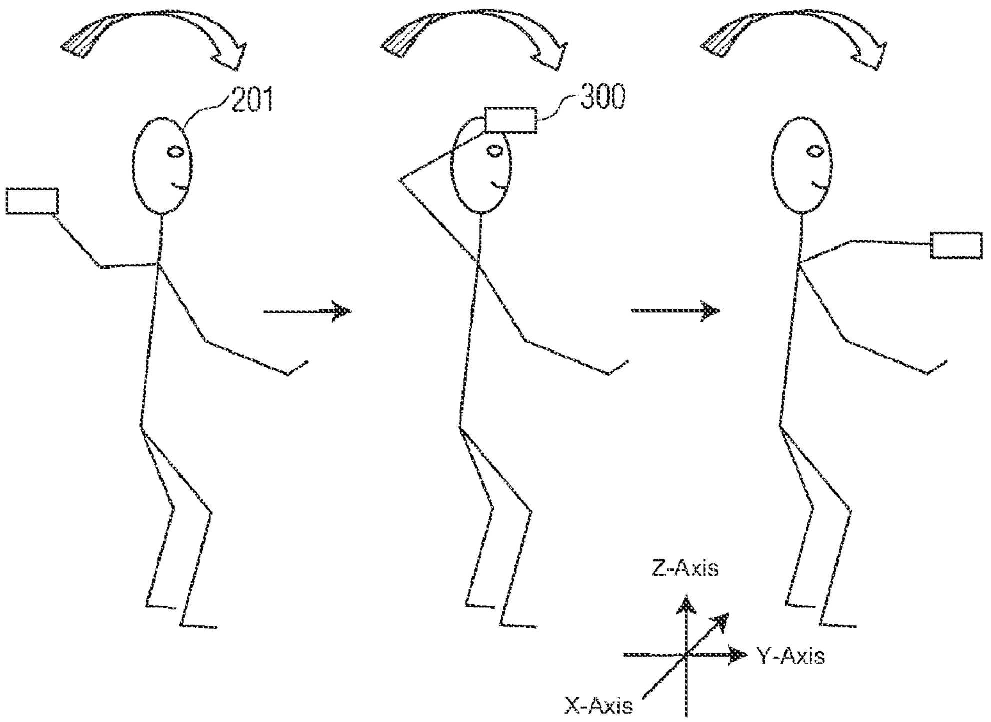
Figure 2B:
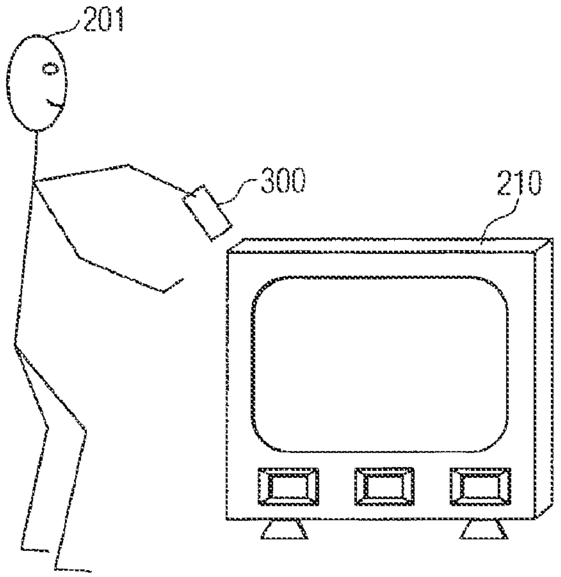

FIGS. 2A-B illustrate gestures that a user can make using the hand-held device 300. FIG. 2A, for example, shows a user 201 making the gesture of throwing the device 300 toward a base device, such as television 210. FIG. 2B shows a user making the gesture of pouring from the device 300 into a base device, such as television 210. The gesture and associated motion indicate that the user 201 would like to transfer data from the hand-held device 300 to the television 210. In this case, the user would first locate and identify the data (e.g. a picture or music) and then make the gesture toward the base device. The data could be identified, for instance, by selecting an item from of a list displayed on the hand-held device 300. The data would then be transferred. In addition, if the data is a picture, it could be (optionally) displayed on the television or, if the data is music, it could be (optionally) played through the speakers. Other gestures include making a pulling motion (not shown) directed from a base device towards the user. In this case, the gesture would indicate that the identified data should be transferred to the hand-held device 300. The data would then be retrieved from either the base device itself, or from another device (e.g. a server). Since there are a number of base devices 210 through 214 located in the area of the user 201, the hand-held device 300 has the ability to identify which device 210-214 should receive the data being transferred (as described in more detail below). FIG. 3 is a schematic block diagram of an exemplary hand-held device 300 of the present invention. As is known in the art, the methods and apparatus discussed herein may be distributed as an article of manufacture that itself comprises a computer-readable medium having computer-readable code means embodied thereon. The computer-readable program code means is operable, in conjunction with a computer system such as central processing unit 301, to carry out all or some of the steps to perform the methods or create the apparatuses discussed herein. The computer-readable medium may be a recordable medium (e.g., floppy disks, hard drives, compact disks, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic medium or height variations on the surface of a compact disk.

Memory 302 will configure the processor 301 to implement the methods, steps, and functions disclosed herein. The memory 302 could be distributed or local and the processor 301 could be distributed or singular. The memory 302 could be implemented as an electrical, magnetic or optical memory, or any combination of these or other types of storage devices. The term "memory" should be construed broadly enough to encompass any information able to be read from or written to an address in the addressable space accessed by processor 301.

Figure 3:
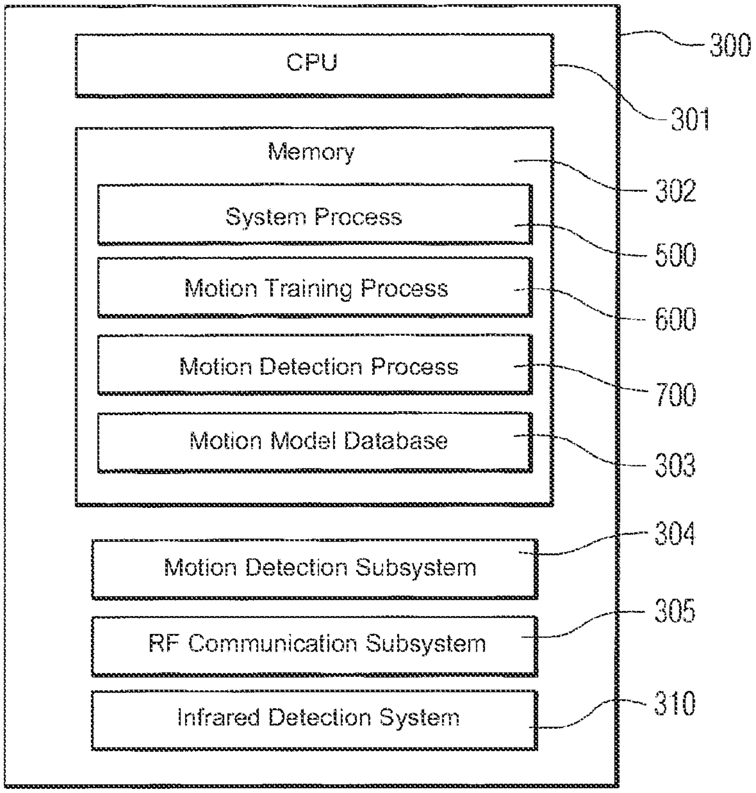
FIG. 3 is a schematic block diagram of the hand-held device of FIG. 1.

As shown in FIG. 3, the memory 302 includes motion model database 303, system process 500, discussed further below in conjunction with FIG. 5, motion training process 600, discussed further below in conjunction with FIG. 6, and motion detection process 700, discussed further below in conjunction with FIG. 7. Hand-held device 300 also includes motion detection subsystem 400, discussed further below in conjunction with FIG. 4, radio frequency (RF) communication subsystem 305, and infrared detection subsystem (IDS) 310.

The RF communication subsystem 305 provides communication between the handheld device 300 and one or more base devices 210-214 in a known manner. For example, the RF communication subsystem 305 may utilize the IEEE 802.11 standard for wireless communications or any extensions thereof. The IDS 310 emits infrared light in a directional manner in order to signal a base device 210-214 that it should execute the command being transmitted by the device 300. Only the base device 210-214 that detects the infrared signal should execute the transmitted command. The command is transferred to the base device 210-214 via the RF communication subsystem 305 in a known manner. In an alternative embodiment, the command may be transferred by modulating the infrared signal (utilizing, for example, the IR Blaster standard) in a known manner.

Figure 4:
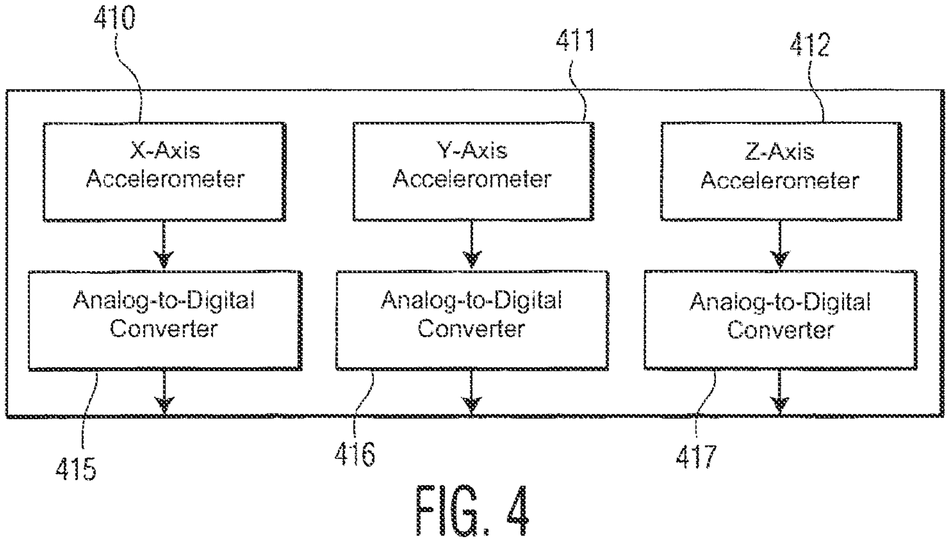
FIG. 4 illustrates an exemplary embodiment of a motion detection subsystem.

FIG. 4 illustrates an exemplary embodiment of motion detection subsystem 400. Motion detection subsystem 400 contains x-axis accelerometer sensor 410, y-axis accelerometer sensor 411, z-axis accelerometer sensor 412, and corresponding analog to digital converters 415, 416, 417. Accelerometer sensors 410, 411, 412 detect the acceleration of the device 300 along the x-axis, y-axis, and z-axis, respectively. The accelerometer sensors 410, 411, 412 may be embodied, for example, using the 3D Motion Sensors commercially available from NECTokin of Union City, Calif. Analog to digital converters 415, 416, 417 convert the acceleration(s) detected by accelerometer sensors 410, 411, 412, respectively, to a digital form that can be read by processor 301. In alternative embodiments, other components, including stress-sensitive resistive elements, tilt sensors, and magnetic direction sensors, may be utilized to determine the position, orientation and/or speed of movement of the device 300.

Figure 5:
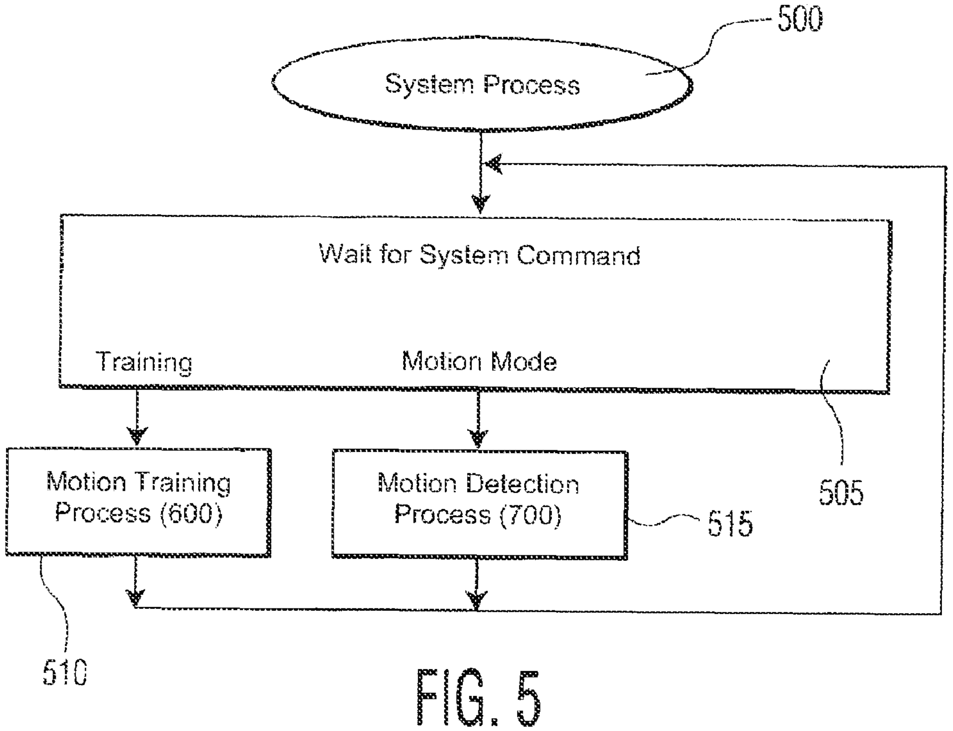
FIG. 5 is a flowchart describing an exemplary implementation of the system process of the hand-held device of FIG. 1.

FIG. 5 illustrates an exemplary embodiment of system process 500. System process 500 initially waits for a command to be entered during step 505. If, during step 505, a user enters a training command, the system process 500 executes step 510 where motion training process 600 is called. If, during step 505, a user makes a gesture or motion indicative of a command, the system process 500 executes step 515 where motion detection process 700 is called. Upon completion of the called processes 600, 700, system process 500 returns to step 505 to wait for the entry of a new command.

Figure 6:
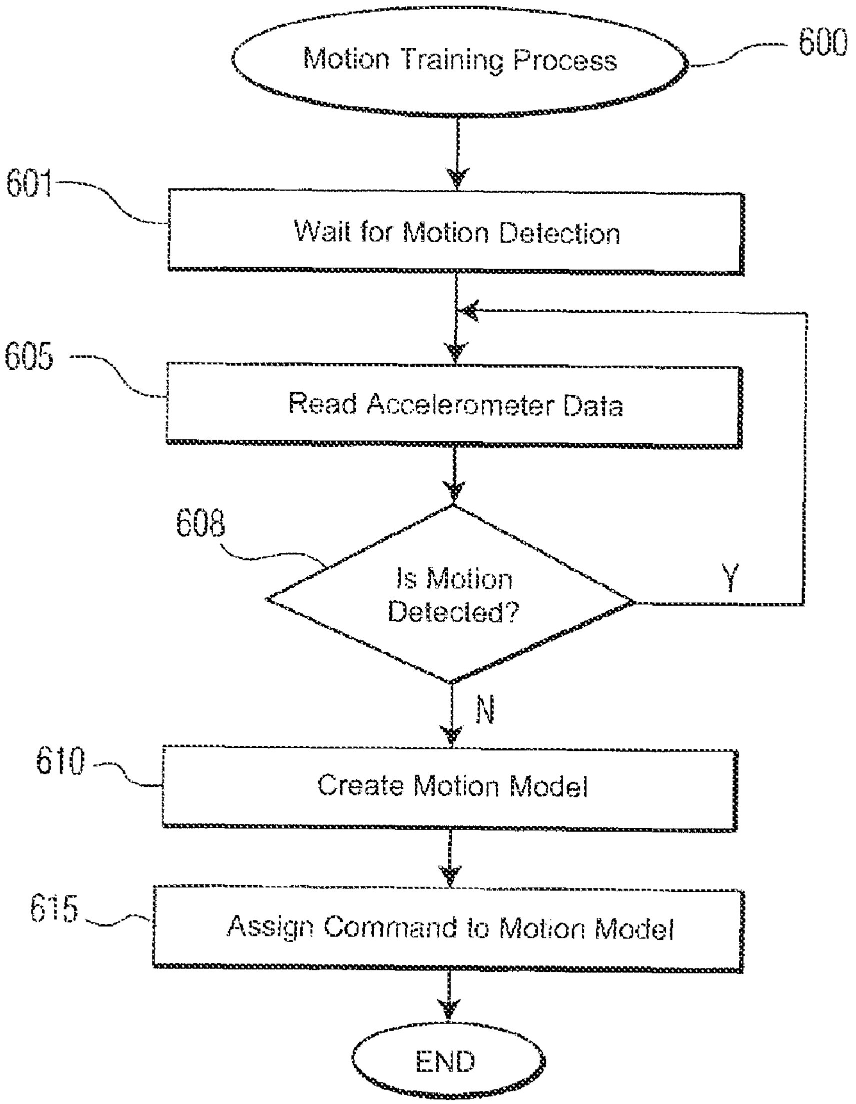
FIG. 6 is a flowchart describing an exemplary implementation of a motion training process.

FIG. 6 illustrates an exemplary embodiment of motion training process 600. Motion training process 600 learns new gestures and motions demonstrated by a user to be used for identifying existing or new commands. For instance, a user 201 may want to train the device 300 to detect a throwing motion, such as the motion of throwing the device 300 toward a television 210. The user first presses a switch on the hand-held device 300 to indicate that a new gesture is to be created. (Alternatively, the user can train the hand-held device 300 to interpret a motion as an indication that the training process should be executed.) Motion training process 600 initially waits for motion to be detected by one or more of the accelerometer sensors 410, 411, 412 (step 601) and then records the motion detected by the sensors 410, 411, 412 by periodically sampling and storing data read from analog to digital converters 415, 416, 417 (step 605). After each set of samples have been read during sampling step 605, a test is made to determine if no motion has been detected for a specified period of time indicating that the gesture or motion has been completed (step 608). If motion is detected during step 608, then step 605 is repeated to read the next set of samples; otherwise, motion training process 600 creates and stores a model of the motion captured during step 610. The motion model is created in a known manner For example, the following publications describe methods for analyzing, comparing and modeling motions and gestures: Ho-Sub Yoon, Jung Soh, Younglae J. Bae and Hyun Seung Yang, Hand Gesture Recognition Using Combined Features of Location, Angle and Velocity, Pattern Recognition, Volume 34, Issue 7, 2001, Pages 1491-1501; Cristopher Lee and Yangsheng Xu, Online, Interactive Learning of Gestures for Human/Robot Interfaces, The Robotics Institute, Carnegie Mellon University, Pittsburgh, IEEE International Conference on Robotics and Automation, Minneapolis, 1996; Mu-Chun Su, Yi-Yuan Chen, Kuo-Hua Wang, Chee-Yuen Tew and Hai Huang, 3D Arm Movement Recognition Using Syntactic Pattern Recognition, Artificial Intelligence in Engineering, Volume 14, Issue 2, April 2000, Pages 113-118; and Ari Y. Benbasat and Joseph A. Paradiso, An Inertial Measurement Framework for Gesture Recognition and Applications, MIT Media Laboratory, Cambridge, 2001 each incorporated by reference herein.

The created model will be used to interpret future gestures and motions made by the user 201. During step 615, the model created during step 610 is assigned a command or process that is to be executed when the motion associated with the model is detected. The command to be executed is identified utilizing well known methods, for instance, pressing a switch on the hand-held device 300 associated with the command or entering a code associated with the command on a keypad. In an alternative embodiment, the user could enter (record) a series of commands by performing the actions on the system (e.g., on the touch screen), similar to recording a macro in MS Word. The series of commands can then be associated to a single gesture. The assigned command or process is stored with the associated motion model in the motion model database 303.

Figure 7:
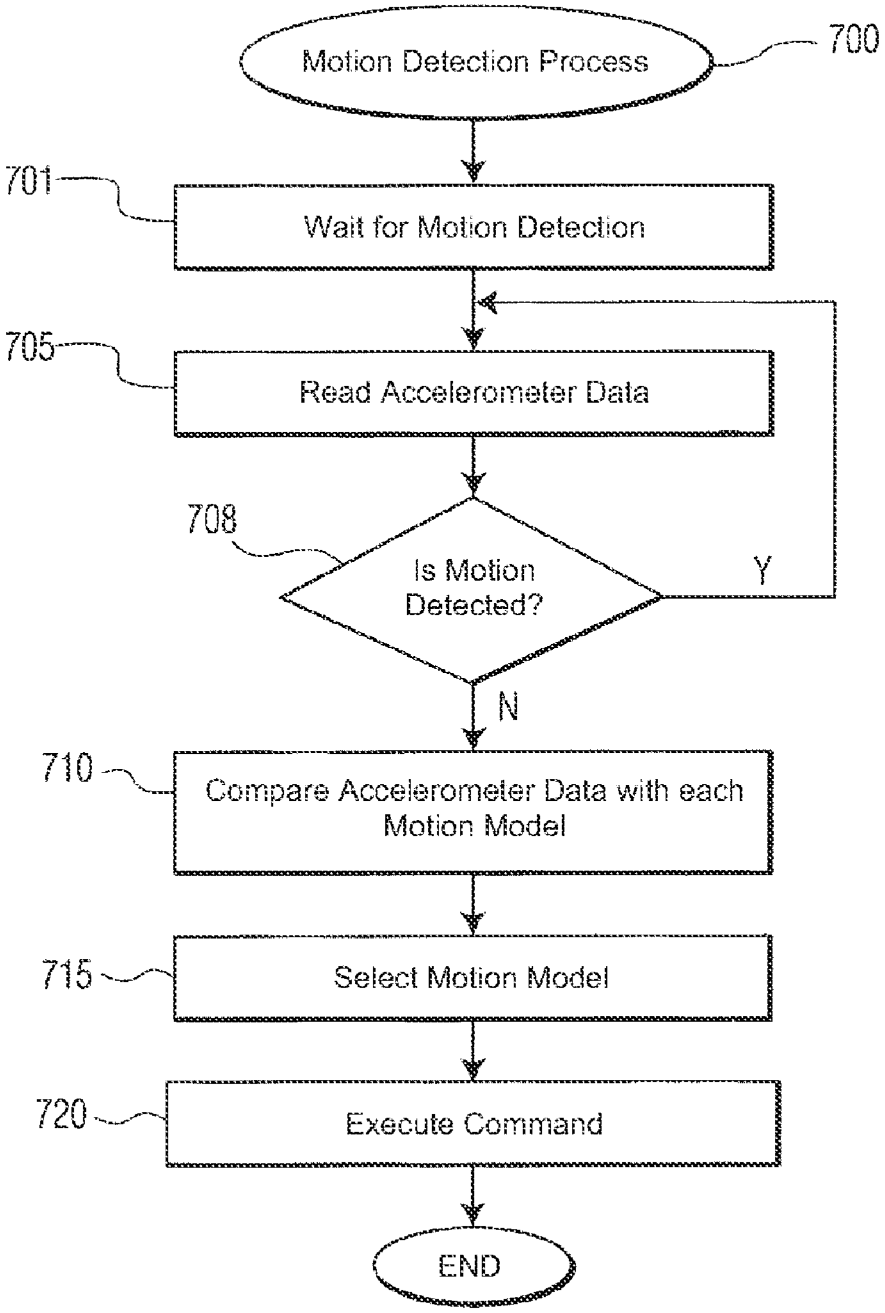
FIG. 7 is a flowchart describing an exemplary implementation of a motion detection process.

FIG. 7 illustrates an exemplary embodiment of motion detection process 700. Motion detection process 700 interprets gestures and motions made by a user 201 to determine the command(s) that are to be executed. For instance, if the user 201 makes the motion of throwing the hand-held device 300 towards the television 210, the hand-held device 300 will interpret the gesture as a command to transfer data from the device 300 to the television 210. Motion detection process 700 initially records the motion detected by the accelerometer sensors 410, 411, 412 by periodically sampling and storing the data read from analog to digital converters 415, 416, 417 (step 705). After each set of samples have been read during sampling step 705, a test is made to determine if no motion has been detected for a specified period of time indicating that the gesture or motion has been completed (step 708). If motion is detected during step 708, then step 705 is repeated to read the next set of samples; otherwise, motion detection process 700 compares the data collected during step 705 to the motion models stored in the device 300 (step 710). During step 710, a score is generated for each model comparison. The command or process associated with the model that attained the highest score during step 710 is then executed during step 715. For example, if the model with the highest score was the "throwing motion" model, then a data transfer process (not shown) would be executed in a known manner. The data transfer process can be accomplished, for example, utilizing the 802.11 standard in a well known manner. During step 720, the IDS 310 is also activated, thereby causing an infrared signal to be emitted in the direction of the throwing motion. Only the base device 210-214 that detects the infrared signal will receive the data transferred via the RF communication subsystem 305.

Figure 8:
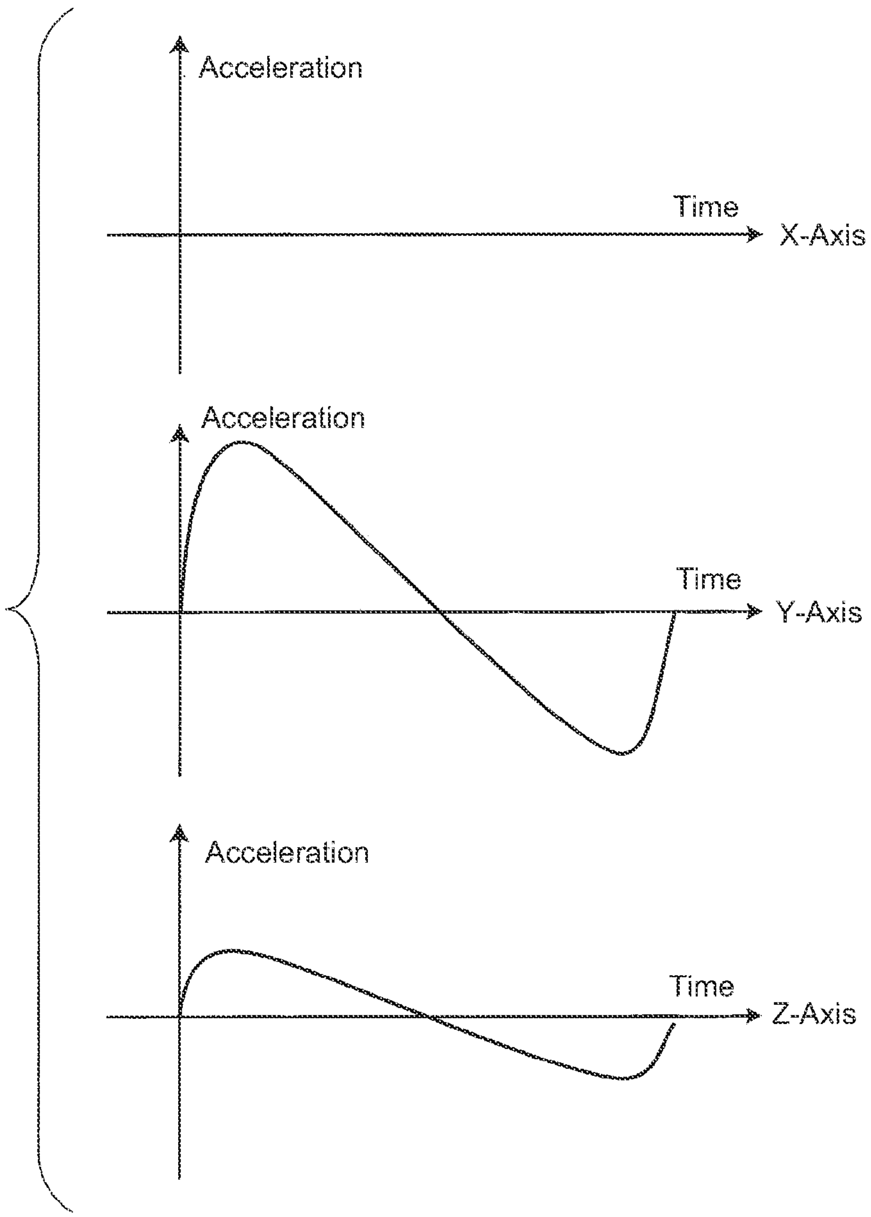
FIG. 8 is a graph illustrating the motion model of a throwing motion based on the expected acceleration in each of three perpendicular planes.

FIG. 8 shows an exemplary motion model representing the throwing motion of FIG. 2A. As is illustrated, the z-axis accelerometer indicates that the motion is in the x-y plane (no motion along the z-axis). As indicated by the x-axis accelerometer, the motion shows a quick acceleration along the x-axis, a peak speed at the halfway point of the motion, and an increasing deceleration as the motion is completed. A similar, but smaller, action is occurring along the y-axis.

It is to be understood that the embodiments and variations shown and described herein are merely illustrative of the principles of this invention and that various modifications may be implemented by those skilled in the art without departing from the scope and spirit of the invention.

The invention claimed is:

1. A hand-held device that wirelessly communicates with a base device, the hand-held device comprising:

a memory for storing at least one of picture data and music data;

a motion detection subsystem configured to detect a motion of the hand-held device, the motion of the hand-held device being made by a user holding the device;

a radio frequency (RF) communications subsystem for wirelessly communicating with the base device; and at least one processor operative to:

interpret the motion of the hand-held device as a command that involves wirelessly transmitting at least one of picture data and music data to the base device; and execute the command to wirelessly transmit at least one of picture data and music data from the hand-held device to the base device in response to interpreting the motion of the hand-held device as the command that involves wirelessly transmitting at least one of picture data and music data to the base device.

2. The hand-held device of claim 1, wherein said execute said command operation includes transferring a second command to said base device.

3. The hand-held device of claim 1, wherein said detected motion is a throwing motion.

4. The hand-held device of claim 1, wherein said detected motion is a pouring motion.

5. The hand-held device of claim 1, wherein said detected motion is a pulling motion directed from said base device.

6. The hand-held device of claim 1, further operative to add one or more new commands by detecting and recording a demonstration motion.

7. The hand-held device of claim 6, further operative to create a motion model from said recorded demonstration motion.

8. The hand-held device of claim 7, further operative to assign said one or more new commands to said motion model.

9. The hand-held device of claim 1, wherein the motion detection subsystem comprises three dimensional motion sensors for performing said motion detection operation.

10. The hand-held device of claim 1, further comprising one or more motion models, wherein each of said one or more motion models is assigned a command.

11. The hand-held device of claim 10, wherein said interpret said motion operation is performed by comparing said detected motion to one or more of said one or more motion models.

12. A method for transferring at least one of picture data and music data from a hand-held device to a base device, the method comprising:

identifying at least one of picture data and music data that is stored in a memory of the hand-held device;

detecting a motion of the hand-held device, wherein the motion of the hand-held device is made by a user that is holding the hand-held device;

interpreting the motion of the hand-held device as a command that involves wirelessly transmitting at least one of picture data and music data to the base device; and wirelessly transmitting at least one of the identified picture data and music data that is stored in memory of the hand-held device to the base device in response to interpreting the motion of the hand-held device as a command that involves wirelessly transmitting at least one of picture data and music data to the base device.

13. The method of claim 12, wherein said detecting motion step is a throwing motion.

14. The method of claim 12, wherein said detecting motion step is a pouring motion.

15. The method of claim 12, wherein said detecting motion step is a pulling motion directed from said base device.

16. The method of claim 12, further comprising the step of adding one or more new commands by detecting and recording a demonstration motion.

17. The method of claim 16, further comprising the step of creating a motion model from said recorded demonstration motion.

18. The method of claim 17, further comprising the step of assigning said one or more new commands to said motion model.

19. The method of claim 12, wherein said interpreting said motion step is performed by comparing said detected motion to one or more motion models.

20. The method of claim 12 wherein:

the motion is detected by a motion detection subsystem of the hand-held device;

the motion is interpreted by a processor of the hand-held device; and the at least one of the identified picture data and music data that is stored in the memory of the hand-held device is wirelessly transmitted to the base device by an RF communications subsystem of the hand-held device.

21. The method of claim 12 further comprising:

interpreting a motion of the hand-held device as a command to display the picture data or to play the music data on the base device;

transmitting the command to display the picture data or to play the music data to the base device.

* * * * *